(12) United States Patent
Kim et al.

(10) Patent No.: US 7,944,283 B2
(45) Date of Patent: May 17, 2011

(54) REFERENCE BIAS GENERATING CIRCUIT

(75) Inventors: Young-Ho Kim, Daejon (KR); Je-Hoon Yun, Daejon (KR)

(73) Assignee: Electronics and Telecommunications Research Institute, Daejon (JP)

( * ) Notice: Subject to any disclaimer, the term of this patent is extended or adjusted under 35 U.S.C. 154(b) by 0 days.

(21) Appl. No.: 12/507,127

(22) Filed: Jul. 22, 2009

(65) Prior Publication Data

US 2010/0141344 A1  Jun. 10, 2010

(30) Foreign Application Priority Data

Dec. 5, 2008  (KR) .................. 10-2008-0123456

(51) Int. Cl.
*G05F 1/10* (2006.01)

(52) U.S. Cl. ........................ 327/539; 323/312

(58) Field of Classification Search ............... 327/513, 327/539; 323/313
See application file for complete search history.

(56) References Cited

U.S. PATENT DOCUMENTS

| | | | | |
|---|---|---|---|---|
| 6,201,436 | B1 * | 3/2001 | Hur et al. | 327/543 |
| 6,906,581 | B2 * | 6/2005 | Kang et al. | 327/539 |
| 7,005,839 | B2 * | 2/2006 | Wada | 323/316 |
| 7,075,282 | B2 * | 7/2006 | Feng | 323/313 |
| 7,166,994 | B2 * | 1/2007 | Lee et al. | 323/313 |
| 7,199,646 | B1 * | 4/2007 | Zupcau et al. | 327/539 |
| 7,495,505 | B2 * | 2/2009 | Chang et al. | 327/539 |
| 7,605,577 | B2 * | 10/2009 | Chung | 323/313 |
| 7,737,675 | B2 * | 6/2010 | Murase | 323/314 |
| 2005/0206362 | A1 * | 9/2005 | Chen | 323/313 |
| 2008/0094130 | A1 * | 4/2008 | Uang et al. | 327/539 |
| 2009/0001958 | A1 * | 1/2009 | Fujii | 323/313 |
| 2009/0146730 | A1 * | 6/2009 | Chen | 327/539 |

FOREIGN PATENT DOCUMENTS

| KR | 1020000022517 A | 4/2000 |
|---|---|---|
| KR | 1020000043624 A | 7/2000 |
| KR | 1020040004023 A | 1/2004 |

OTHER PUBLICATIONS

Ming-Dou Ker, et al; "New Curvature-Compensation Technique for CMOS Bandgap Reference with Sub-1-V Operation", ISACAS2005, vol. 4, pp. 3861-3864, May 2005.
Yeong-Tsair Lin, et al; "A Low Voltage CMOS Bandgap Reference", IEEE-NEWCAS Conference, pp. 227-230, Jun. 2005.

\* cited by examiner

*Primary Examiner* — Thomas J Hiltunen
(74) *Attorney, Agent, or Firm* — Ladas & Parry LLP

(57) ABSTRACT

A reference current bias circuit includes a self-bias circuit configured to provide a bias current to an amplifier; a basic bandgap circuit coupled to inputs of the amplifier; a startup circuit configured to support an initial operation of the amplifier; a temperature compensator configured to include a first mirroring unit for mirroring current according to a positive temperature coefficient characteristic from the basic bandgap circuit; and a second mirroring unit for mirroring current according to a negative temperature coefficient characteristic from the basic bandgap circuit, and to provide a reference current by combining the current of the first mirroring unit and the current of the second mirroring unit; and a reference current mirroring unit configured to generate reference current biases based on the reference current from the temperature compensator.

10 Claims, 5 Drawing Sheets

REFERENCE BIAS GENERATING CIRCUIT

CROSS-REFERENCE TO RELATED APPLICATIONS

The present invention claims priority of Korean Patent Application No. 10-2008-0123456, filed on Dec. 5, 2008, which is incorporated herein by reference.

BACKGROUND OF THE INVENTION

1. Field of the Invention

The present invention relates to a reference bias generating circuit; and, more particularly, to a low-voltage reference bias generating circuit.

2. Description of Related Art

In general, a circuit of an electronic system is formed in an integrated chip including a plurality of active elements and passive elements. Each of the elements in the electronic system requires a reference bias circuit. The reference bias circuit generates a reference voltage and a reference current for stable operation of the electronic system. Therefore, the bias circuit is an important element in an electronic system.

Overall power consumption of an electronic system has increased due to the diversification of applications and the increments of functions to provide to a user. Accordingly, it is important to improve the battery efficiency of an electronic system that is not continuously applied with a predetermined voltage. In order to reduce the power consumption, circuits with a low supply voltage have to be developed and a reference bias circuit has to be also advanced to operate in a low supply voltage.

In general, elements of an electronic system have properties that change according to a temperature. For example, passive elements such as resistors or inductors have a resistance value increasing in proportion to a temperature. Also, a semiconductor element having particular conjunction (PN junction) such as a diode or a transistor has a resistance value increasing in reverse proportion to a temperature. Such elements may have linear property or non-linear property for the temperature. Accordingly, a reference bias circuit is also generally influenced by the temperature. In a system with various ICs, the increment of an internal temperature or an external temperature influences badly the performance of an electronic system. Therefore, there has been a demand for a bias circuit that can be driven with a low supply voltage and less sensitive to a temperature variation.

Hereinafter, a bandgap bias circuit for generating uniform bias currents/voltages regardless of temperature variation will be described.

Figure 1:
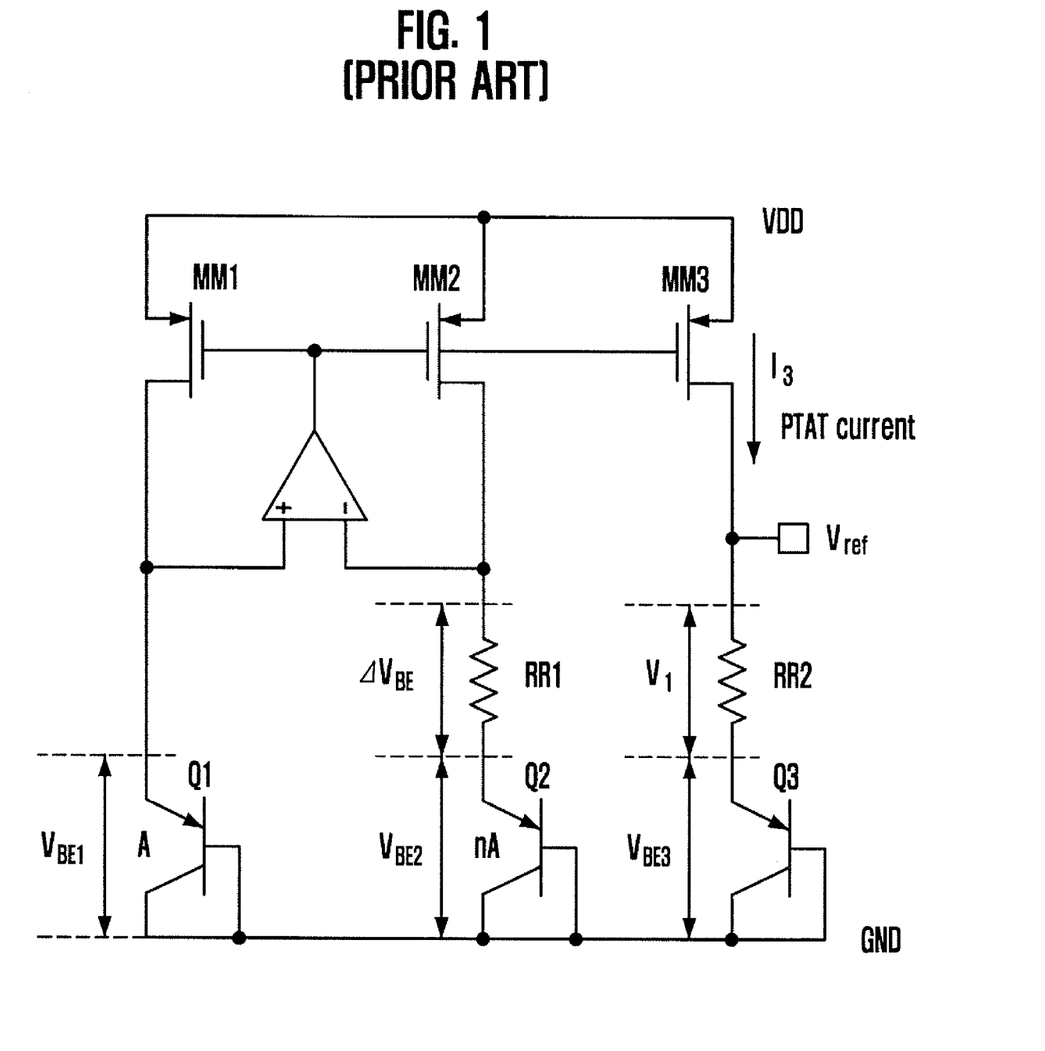
FIG. 1 is a diagram illustrating a conventional bandgap bias circuit for generating a constant voltage.

FIG. 1 is a conventional bandgap bias circuit for generating a uniform bias voltage.

Referring to FIG. 1, the conventional bandgap bias circuit includes first to third transistors MM1, MM2, and MM3, first to third bipolar junction transistors Q1, Q2, and Q3, and an OP-AMP.

Here, a voltage $\Delta V_{BE}$ applied to a first resistor RR1 is a difference between a base-emitter voltage $V_{BE1}$ of the first bipolar junction transistor Q1 and a base-emitter voltage $V_{BE2}$ of the second bipolar junction transistor Q2.

A current $I_3$ flowing to the third transistor MM3 by mirroring the RR1 current is proportional to the current flowing through the first resistor RR1. Therefore, a reference voltage $V_{ref}$ outputted from the bandgap bias circuit is the sum of a voltage $V_1$ applied to both terminals of a second resistor RR2 and a base-emitter voltage $V_{BE3}$ between the emitter and base of the third bipolar junction transistor Q3.

Here, the voltage $V_1$ applied to the both terminals of the second resistor RR2 can be expressed as Eq. 1 based on the Ohm's law.

$$V_1 = I_3 \times RR_2 \qquad \text{Eq. 1}$$

The voltage $V_{BE3}$ between the emitter and the base of the third bipolar junction transistor Q3 is referred to as '$V_2$'. As described above, each of the elements has its property changing according to temperature. Therefore, the reference voltage $V_{ref}$ according to the temperature can be expressed as Eq. 2.

$$V_{ref} 32 \ \alpha_1 V_1 + \alpha_2 V_2 \qquad \text{Eq. 2}$$

In Eq. 2, $\alpha_1$ denotes a temperature coefficient for a resistance value of the second resistor RR2, and $\alpha_2$ denotes a temperature coefficient about $V_{BE3}$ of the third bipolar junction transistor Q3.

In order to satisfy the reference voltage having a constant value according to the temperature, the differentiation of Eq. 2 for temperature must have relation of Eq. 3.

$$\frac{\alpha_1 \Delta V_1}{\Delta T} + \frac{\alpha_2 \Delta V_2}{\Delta T} = 0 \qquad \text{Eq. 3}$$

The sum of two differential values in Eq. 3 will be 0 if two values are the same with the opposite sign.

In a conventional bandgap bias circuit, a diode-PN junction voltage $V_{BE}$ of a bipolar junction transistor has negative relation in proportion to temperature variation. A base-emitter voltage difference of two bipolar junction transistors having a different current amount has positive relation in proportion to temperature variation due to a difference of voltage gradients. Therefore, a reference voltage $V_{ref}$ generated from a bandgap bias circuit can be expressed as Eq. 4.

$$V_{ref} \approx V_{BE3} + \frac{R_2}{R_1} \Delta V_{BE} \approx V_{BE3} + k \cdot V_t \ln n \approx 1.25 \text{ V} \qquad \text{Eq. 4}$$

The reference voltage $V_{ref}$ generated from this bandgap bias circuit is decided based on the sum of the base-emitter voltage difference $\Delta V_{BE}$ and the base-emitter voltage $V_{BE3}$ of the third bipolar junction transistor Q3. Here, it is possible to provide a low reference voltage less sensitive to temperature variation by attenuating a temperature variable which can be controlled a resistance ratio RR1/RR2 and a coefficient k having a temperature characteristic gradient opposite to the base-emitter voltage $V_{BE3}$ of the third bipolar junction transistor Q3.

However, such a bandgap bias circuit according to the prior art has an excellent temperature compensation characteristic at around a reference voltage of 1.25V theoretically as shown in Eq. 4. Therefore, it cannot be applied to circuits using a supply voltage lower than 1.2V. So, there is a demand for developing an apparatus and method for stably and uniformly providing a reference current and a reference voltage even in a low supply voltage such as lower than 1.2V.

SUMMARY OF THE INVENTION

An embodiment of the present invention is directed to providing a reference bias generating circuit for providing a stable voltage.

Another embodiment of the present invention is directed to providing a reference bias generating circuit for providing a stable current.

Another embodiment of the present invention is directed to providing a reference bias circuit for reducing power consumption.

Another embodiment of the present invention is directed to providing a reference bias circuit for reducing a chip area.

In accordance with an aspect of the present invention, there is provided a reference current bias circuit, including a self-bias circuit configured to provide a bias current to an amplifier; a basic bandgap circuit coupled to inputs of the amplifier; a startup circuit configured to support an initial operation of the amplifier; a temperature compensator configured to include a first mirroring unit for mirroring current according to a positive temperature coefficient characteristic from the basic bandgap circuit; and a second mirroring unit for mirroring current according to a negative temperature coefficient characteristic from the basic bandgap circuit, and to provide a reference current by combining the current of the first mirroring unit and the current of the second mirroring unit; and a reference current mirroring unit configured to generate reference current biases based on the reference current from the temperature compensator.

In accordance with another aspect of the present invention, there is provided a reference voltage bias circuit including a self-bias circuit configured to provide a bias current to an amplifier; a basic bandgap circuit coupled to inputs of the amplifier; a startup circuit configured to support an initial operation of the amplifier; a temperature compensator configured to include a first mirroring unit for mirroring current according to a positive temperature coefficient characteristic from the basic bandgap circuit, a second mirroring unit for mirroring current according to a negative temperature coefficient characteristic from the basic bandgap circuit, and to provide a reference current by combining the current of the first mirroring unit and the current of the second mirroring unit; and a reference voltage providing unit configured to generate reference voltage biases based on the reference current from the temperature compensator.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter.

Figure 2A:
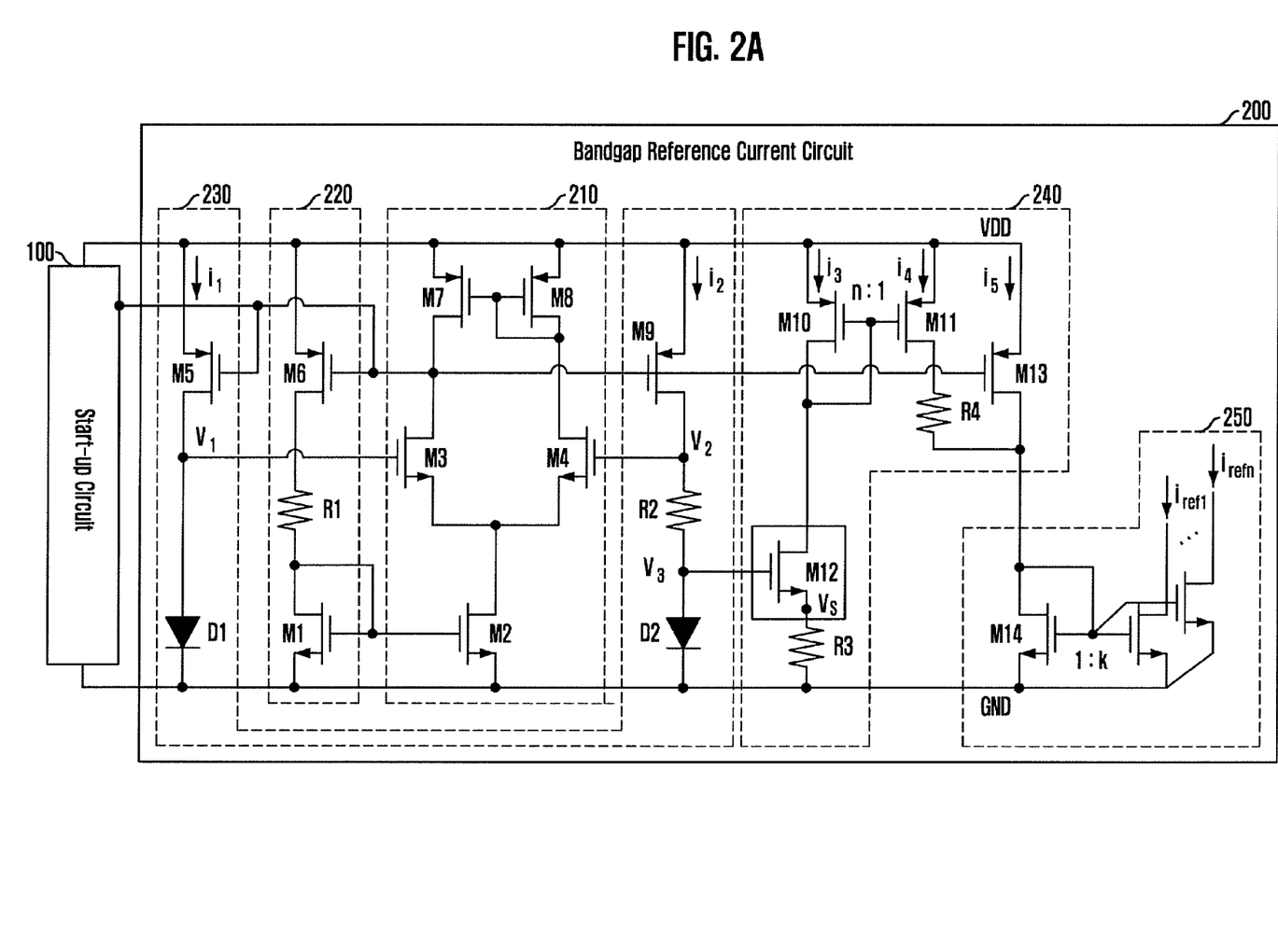
FIG. 2A is a diagram illustrating a reference current bias circuit for low supply voltage in accordance with an embodiment of the present invention.

FIG. 2A is a diagram illustrating a reference current bias circuit for low supply voltage in accordance with an embodiment of the present invention.

Referring to FIG. 2A, the reference current bias circuit according to the present embodiment includes a start-up circuit 100 and a bandgap reference current circuit 200. The start-up circuit 100 supports an initial operation of the reference current bias circuit to quickly reach a normal state without falling into an abnormal zero state. The bandgap reference current circuit 200 includes an amplifier 210, a self-bias unit 220 for driving the amplifier 210, a basic bandgap unit 230 having two input terminals, a temperature compensator 240 for eliminating a temperature variation characteristic, and a reference current mirroring unit 250 for generating reference currents. The bandgap reference current circuit 200 stably provides reference currents in a low supply voltage although temperature changes.

The basic bandgap unit 230 includes a fifth transistor M5, a first diode D1, a ninth transistor M9, a second resistor R2, and a second diode D2. The amplifier 210 includes five transistors M2, M3, M4, M7 and M8, and the self-bias unit 220 includes two transistors M1 and M6 and a first resistor R1. The temperature compensator 240 includes four transistors M10 to M13 and third and fourth resistors R3 and R4. The reference current mirroring unit 250 includes a fourteenth transistor M14 and n transistors for mirroring the temperature compensated current of the fourteenth transistor M14 to provide the mirrored bias currents to sub circuit blocks.

Hereinafter, the operation of the bandgap reference current circuit 200 according to the present embodiment will be described with reference to FIG. 2A.

When power is applied to the bandgap reference current circuit 200, the start-up circuit 100 prevents the abnormal state of the amplifier 210 and the self-bias circuit 220 gives a bias current to the amplifier 210 by a feedback loop. Since the start-up circuit 100 is well known to those skilled in the prior art, detail description thereof is omitted. The amplifier 210 makes two nodes V1 and V2 of The basic bandgap circuit 230 to be same. Therefore, a voltage applied to the second resistor R2 is equal to a value obtained by subtracting a voltage $V_3$ of the second diode D2 from a voltage $V_1$ of the first diode D1. Herein, currents flowing through the first and second diodes D1 and D2 are controlled by a junction area ratio of each diode. For example, if the junction area ratio of the first and second diodes D1 and D2 is 1:P, current as much as P flows through the second diode D2 and current as much as 1 flows through the first diode D1. The junction area ratio of the diodes can be controlled by the number of the parallel connections of a diode with same area.

In order to reduce the number of used diodes, a current $i_1$ flowing through the fifth transistor M5 and a current $i_2$ flowing through the ninth transistor M9 have a current ratio of K:1 where K>1. That is, if the current $i_2$ flowing through the ninth transistor M9 is 1, the current $i_1$ flowing through the fifth transistor M5 is K. It can be done by controlling the dimension W/L of M5 and M9. The current $i_2$ of the ninth transistor M9 is equal to the current of the second resistor R2 and can be calculated by Ohm's law. The voltage of the second resistor R2 can be expressed as difference between the voltage $V_2$ and the voltage $V_3$ due to the voltage $V_2$ is same with the voltage $V_1$. If the ninth transistor M9 and the thirteenth transistor M13 have a same dimension W/L, the current $i_2$ flowing through the ninth transistor M9 is mirrored to the thirteenth transistor M13 with the same current. Such the current $i_5$ of the thirteenth transistor M13 can be expressed as Eq. 5.

$$i_5 = i_2 = \frac{V_2 - V_3}{R_2} = \frac{V_1 - V_3}{R_2} = \frac{\Delta V_d}{R_2} \qquad \text{Eq. 5}$$

Since the second resistor R2 is a passive element and it has a positive characteristic proportional to a temperature.

The voltage $V_3$ of the second diode D2 is inputted to a gate of the twelfth transistor M12 with a long channel length in order to obtain a negative temperature characteristic. The use of a MOSFET transistor with the long channel length is mean to overcome channel length modulation. That is, the use of the long channel length prevents a drain current of a transistor from changing when a drain-source voltage is changed. Accordingly, the drain current is not changed although a drain-source voltage is changed. The drain current is only changed by a signal inputted to a gate. In general, a current of a long channel transistor can be expressed as Eq. 6.

$$i_d = \frac{1}{2}\mu_n C_{ox} \frac{W}{L}(V_{GS} - V_{th})^2 \qquad \text{Eq. 6}$$

The current $i_3$ of the tenth transistor M10 is equal to a current of the third resistor R3. The current $i_3$ is expressed as a value obtained by dividing the source voltage of the twelfth transistor M12 by the third resistor R3.

A gate-source voltage $V_{GS}$ of the twelfth transistor M12 is a difference between the gate voltage $V_3$ and a source voltage $V_s$ of the twelfth transistor M12 ($V_{GS}=V_3-V_s$). Therefore, the current $i_3$ can be expressed as Eq. 7.

$$i_3 = \frac{V_s}{R_3} = \frac{\kappa}{2}(V_3 + V_{th} - V_s)^2 \qquad \text{Eq. 7}$$

where $$\kappa = \mu_n C_{ox} W/L$$

The source voltage $V_s$ can be expressed as Eq. 8.

$$V_s = V_3 - V_{th} + \frac{1}{\kappa R_3} + \sqrt{2 \cdot (V_3 - V_{th}) \cdot \frac{1}{\kappa R_3} + \left(\frac{1}{\kappa R_3}\right)^2} \qquad \text{Eq. 8}$$

The source voltage $V_s$ of the twelfth transistor M12 has a negative temperature characteristic similar to the temperature characteristic of the voltage $V_3$ having a negative gradient. The current $i_3$ can be calculated based on Eq. 7 with the source voltage $V_s$ expressed in Eq. 8. That is, the current $i_3$ can be expressed as Eq. 9.

$$i_3 = \frac{\kappa}{2}(V_3 + V_{th} - V_s)^2 \qquad \text{Eq. 9}$$

-continued $$= \frac{1}{R_3}(V_3 - V_{th} + \frac{1}{\kappa R_3} + \sqrt{\frac{2(V_3 - V_{th})}{\kappa R_3} + \left(\frac{1}{\kappa R_3}\right)^2}) \approx \frac{1}{R_3}(\alpha_1 V_3 + \alpha_2)$$

In Eq. 9, the current $i_3$ includes the component of $V_3$ of the second diode D2 having a negative temperature characteristic. That is, the current $i_3$ has a negative temperature characteristic.

A threshold voltage $V_{TH}$ is defined as $V_{TH0}+\gamma(\sqrt{2\Phi_f V_{SB}}-\sqrt{2\Phi_f})$. The threshold voltage $V_{TH}$ has a very small temperature characteristic that can be ignored because it is small compared to the temperature characteristic of a voltage of a diode.

As a result, a current flowing through the fourteenth transistor M14 is equal to the sum of $i_5$ and $i_4$. Where is, the current $i_5$ flowing through the thirteenth transistor M13 has a positive temperature characteristic, and the current $i_4$ flowing through the fourth resistor R4 has a negative temperature characteristic. Therefore, the fourteenth transistor M14 can generate a reference current less sensitive to temperature variation. The current $i_{M14}$ can be expressed as Eq. 10.

$$i_{M14} = i_4 + i_5 \approx \frac{i_3}{N} + \frac{\Delta V_d}{R_2} \approx \frac{a_1 V_d + a_2}{N \cdot R_3} + \frac{\Delta V_d}{R_2} \qquad \text{Eq. 10}$$

The current $i_4$ flowing into the eleventh transistor M11 can be controlled using an area ratio of the tenth transistor M10 and the eleventh transistor M11. In the present embodiment, the current ratio of the current of the tenth transistor M10 and the current of the eleventh transistor M11 is N:1. The fourth resistor R4 is used to adjust a DC-voltage level.

The current $i_{M14}$ expressed in Eq. 10 can generate a stable reference current regardless of temperature variation through controlling a coefficient value. This current can be applied to circuits needed the reference current bias by being mirrored through the fourteenth transistor M14 having a diode connection structure.

Figure 3A:
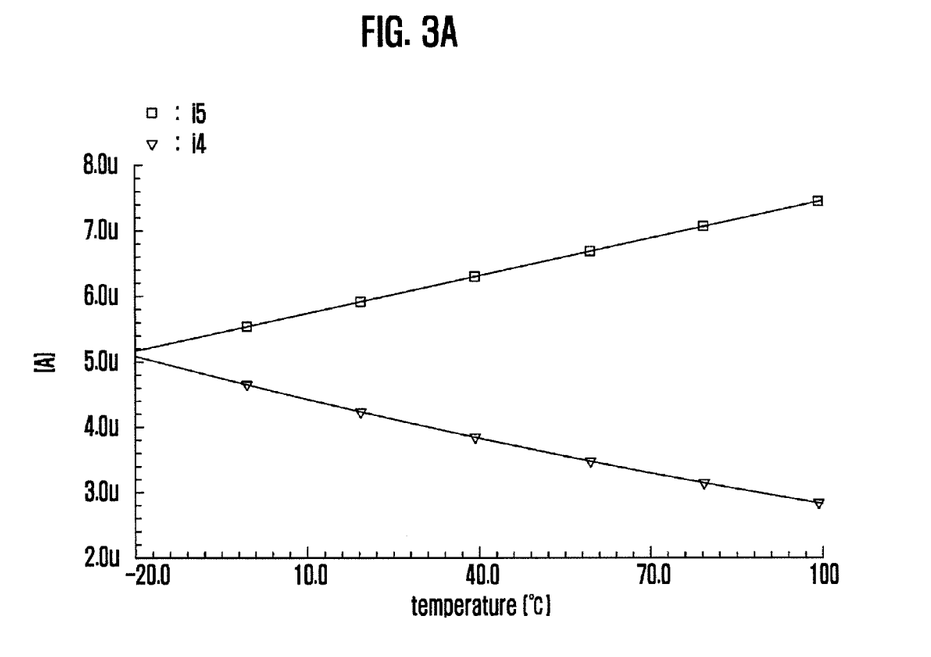
FIG. 3A is a graph showing a current gradient according to temperature.

FIG. 3A shows a gradient of a current according to a temperature.

As shown in FIG. 3A, the current $i_4$ has a negative gradient according to a temperature. The current $i_5$ has a positive gradient according to a temperature.

Figure 3B:
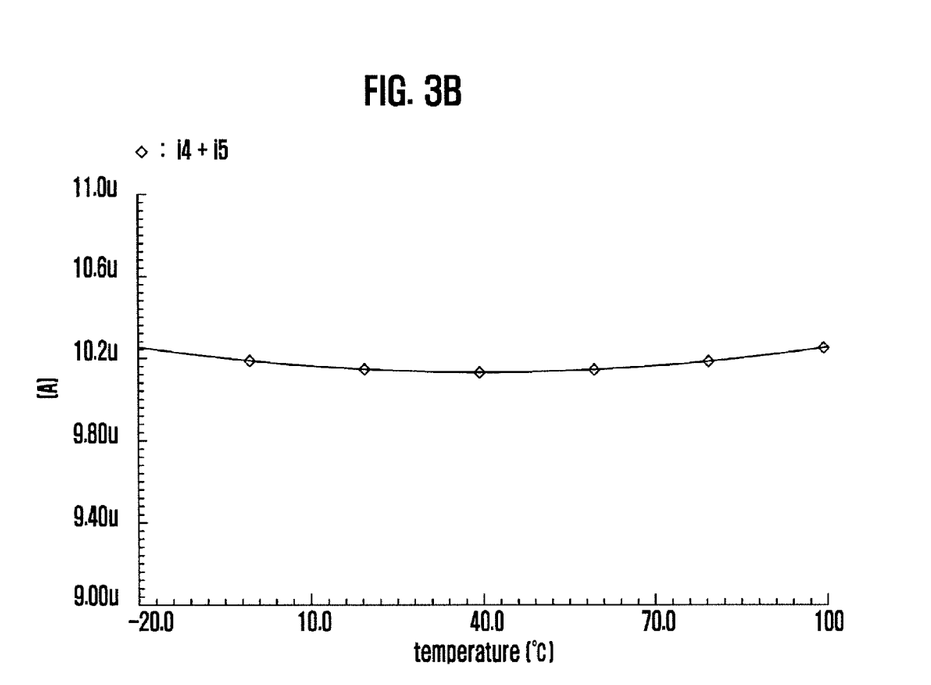
FIG. 3B is a graph showing a reference current generated by combining two currents of FIG. 3A and having a gradient not changing according to temperature.

FIG. 3B shows a reference current obtained by combining two currents of FIG. 3A. The value of the reference current has a stable bias current characteristic less sensitive to temperature variation.

Figure 2B:
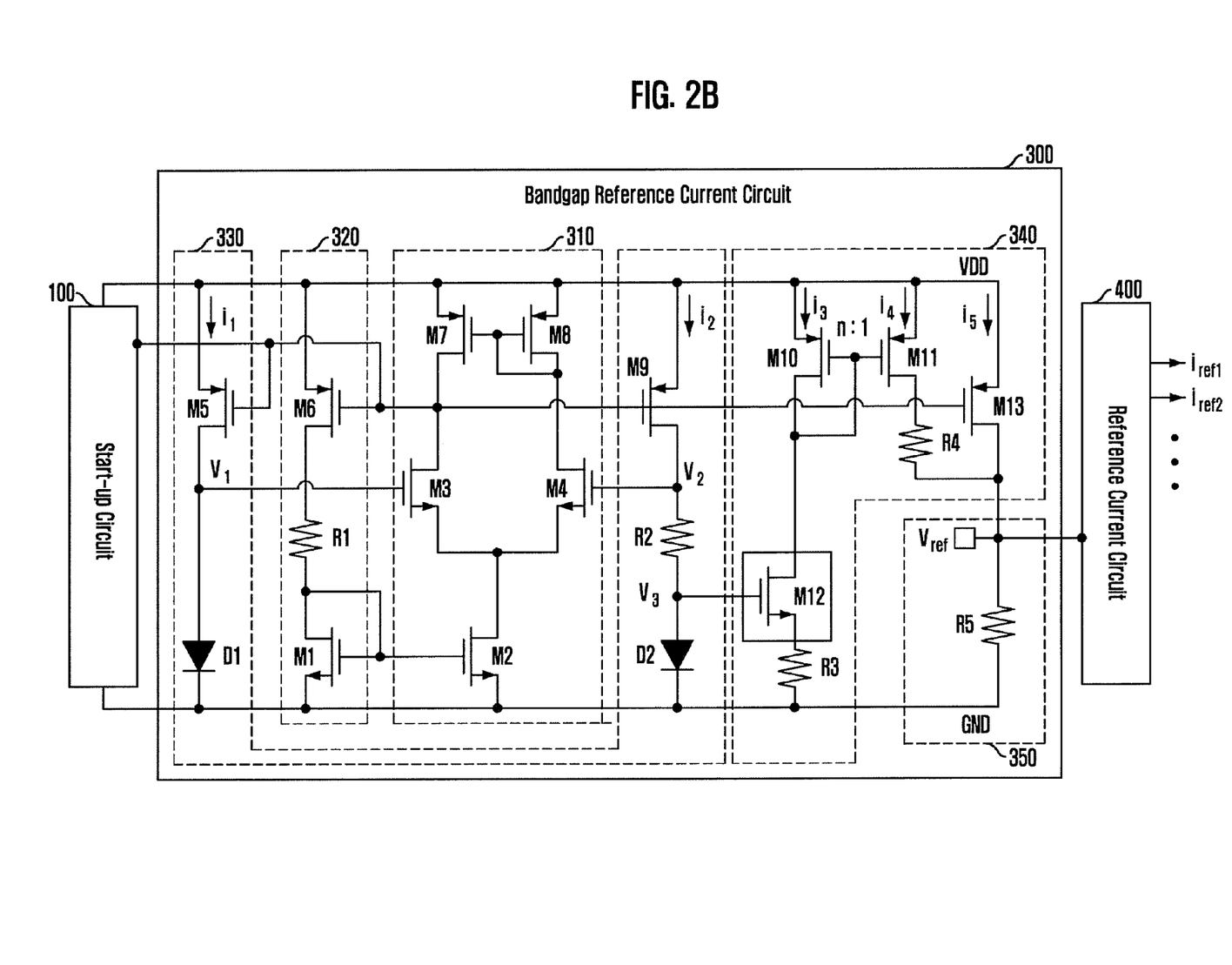
FIG. 2B is a diagram illustrating a reference voltage bias circuit for low supply voltage in accordance with another embodiment of the present invention.

FIG. 2B is a diagram illustrating a reference voltage bias circuit for a low supply voltage in accordance with another embodiment of the present invention. Compared to the reference current bias circuit shown in FIG. 2A, the reference voltage bias generating circuit according to the present embodiment includes a reference voltage generating block instead of the reference current mirroring unit 250.

The reference voltage bias circuit according to the present embodiment includes the same constituent elements of the reference current bias circuit of FIG. 2B except a reference voltage providing unit 350. Therefore, detail description of the same constituent elements is omitted. Hereinafter, the reference voltage providing unit 350 according to the present embodiment will be described.

In FIG. 2B, the reference voltage bias circuit includes a start-up circuit 100, a bandgap reference voltage circuit 300, and a reference current circuit 400 using a reference voltage thereof. The bandgap reference voltage circuit 300 has the same operation property of the bandgap reference current circuit 200 of FIG. 2A and the temperature compensated current flows through a fifth resistor R5. It generates a new voltage, that is, a reference voltage expressed as Eq. 11.

$$V_{ref} = (i_2 + N \cdot i_3) \cdot R_5 \approx \left( \frac{a_1 V_d + a_2}{N \cdot R_3} + \frac{\Delta V_d}{R_2} \right) \cdot R_5 \qquad \text{Eq. 11}$$

In Eq. 11, the reference voltage is lower than 1V and a stable voltage regardless of temperature variation by controlling a resistance value and a mirror current ratio.

Figure 3C:
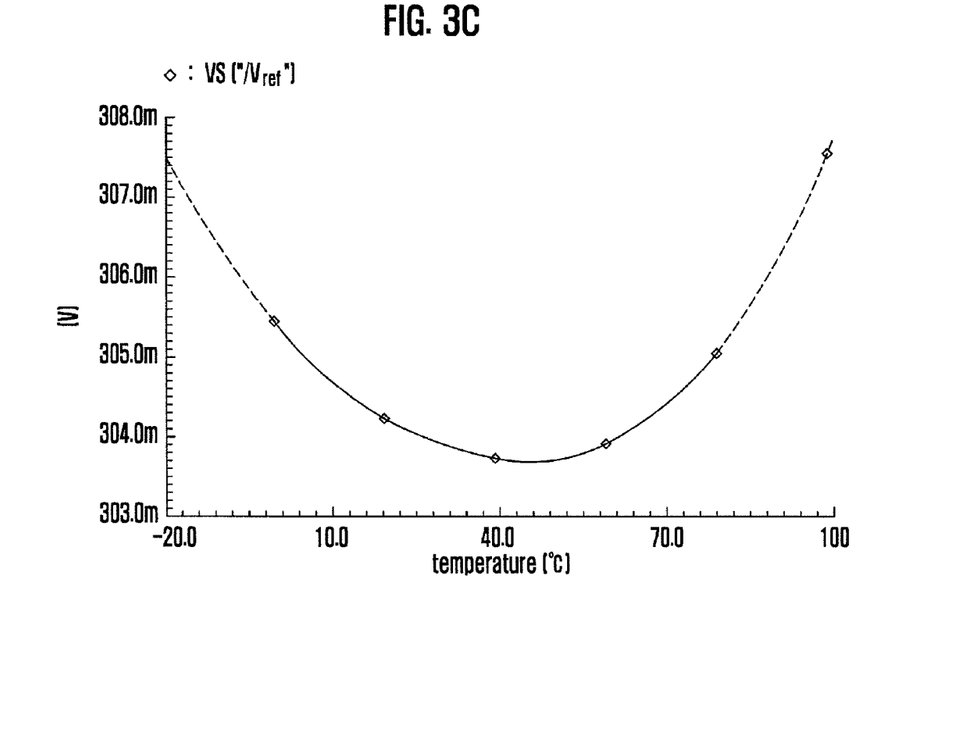
FIG. 3C is a graph showing a stabilized reference voltage generated through coefficient control for temperature compensation.

FIG. 3C is a graph showing relation between a temperature and the output voltage.

As shown, a reference voltage, which is generated for temperature compensation through controlling a coefficient, has a stable value that is less changed although a temperature is changed.

Figure 3D:
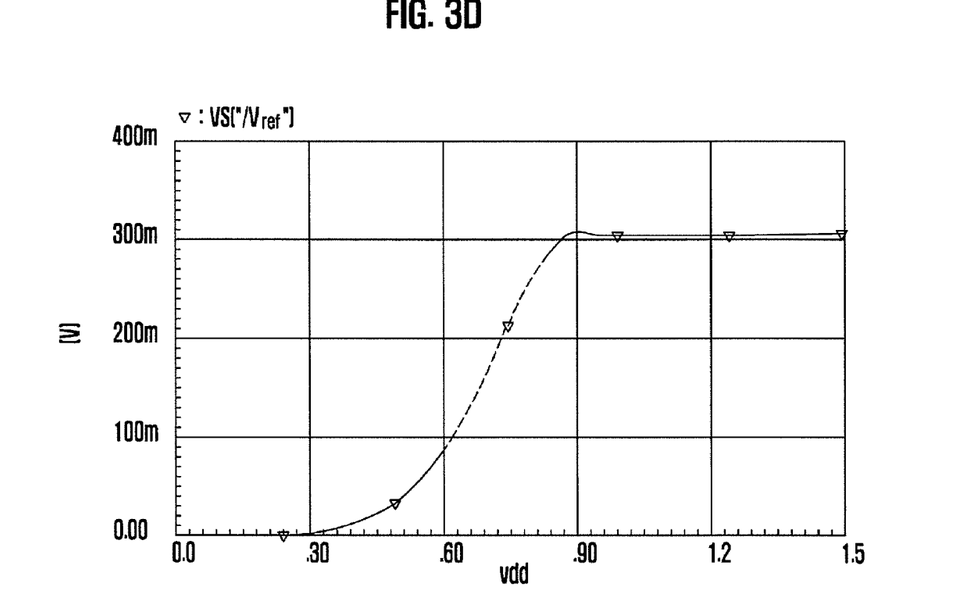
FIG. 3D is a graph showing a reference voltage that can be provided even in supply voltage variation lower than 1.5V.

FIG. 3D is a graph showing a value of a reference voltage that can be provided even in supply voltage variation lower than 1.5V.

As shown in FIG. 3D, a reference voltage is sustained at about 300 mV when a supply voltage VDD is higher than 0.9V.

As described above, the bias circuit for low supply voltage according to the present invention can generate a reference current and a reference voltage less sensitive to temperature variation. That is, the proposed reference bias circuit can provide a stable voltage and a stable current although a temperature is changed. Therefore, it is possible to reduce power consumption of total system.

While the present invention has been described with respect to the specific embodiments, it will be apparent to those skilled in the art that various changes and modifications may be made without departing from the spirit and scope of the invention as defined in the following claims.

What is claimed is:

1. A reference current bias circuit, comprising:
   a self-bias circuit configured to provide a bias current to an amplifier;
   a basic bandgap circuit coupled to inputs of the amplifier;
   a startup circuit configured to support an initial operation of the amplifier;
   a temperature compensator configured to include a first mirroring unit for mirroring current according to a positive temperature coefficient characteristic from the basic bandgap circuit; and a second mirroring unit for mirroring current according to a negative temperature coefficient characteristic from the basic bandgap circuit, and to provide a reference current by combining the current of the first mirroring unit and the current of the second mirroring unit; and
   a reference current mirroring unit configured to generate reference current biases based on the reference current from the temperature compensator,
   wherein the second mirroring unit includes:
   an NMOS transistor with long channel length configured to have a source coupled to the ground through a first resistor, a gate connected to the P-node of a PN-junction element of a basic bandgap circuit and a drain connected to a current mirror; and
   the current mirror configured to mirror a current flowing through the first resistor connected to the output of the first mirroring unit and to the input of the reference current mirroring unit through a second resistor,
   wherein the current mirror comprises two PMOS transitors and has the area ratio of N:1 to control the mirroring current for the temperature compensation between the positive temperature coefficient and the negative temperature coefficient and to have a low power consumption and small layout area of the first resistor.

2. The reference current bias circuit of claim 1, wherein the basic bandgap circuit includes:
   a first input terminal configured to include a first PMOS transistor having a source connected to a supply voltage, a gate connected to an output of the amplifier and a drain connected to a negative input of the amplifier; and a first PN-junction element whose P-node is connected to the drain of the first PMOS transistor and N-node is connected a ground; and
   a second input terminal configured to include a second PMOS transistor having a source connected to the supply voltage, a gate connected to the output of the amplifier, and a drain connected to a positive input of the amplifier; a third resistor having a first terminal connected to the drain of the second PMOS transistor; and a second PN-junction element whose P-node is connected to a second terminal of the third resistor and N-node is connected the ground.

3. The reference current bias circuit of claim 2, wherein a junction area ratio of the first and second PN-junction elements controls a gradient for temperature compensation corresponding to currents flowing through the first and the second PN-junction elements.

4. The reference current bias circuit of claim 2, wherein a junction area ratio of the first and second PN-junction elements is decided with the number of a same area's PN-junction element.

5. The reference current bias circuit of claim 2, wherein the first mirroring unit includes:
   a current mirror structure having a third PMOS transistor whose source is connected to the supply voltage, gate is connected to the gate of the second PMOS transistor of the basic bandgap circuit to get the positive temperature coefficient characteristic, and drain is connected to the second mirroring unit and the reference current mirroring unit.

6. A reference voltage bias circuit, comprising:
   a self-bias circuit configured to provide a bias current to an amplifier;
   a basic bandgap circuit coupled to inputs of the amplifier;
   a startup circuit configured to support an initial operation of the amplifier;
   a temperature compensator configured to include a first mirroring unit for mirroring current according to a positive temperature coefficient characteristic from the basic bandgap circuit, a second mirroring unit for mirroring current according to a negative temperature coefficient characteristic from the basic bandgap circuit, and to provide a reference current by combining the current of the first mirroring unit and the current of the second mirroring unit; and
   a reference voltage providing unit configured to generate reference voltage bias based on the reference current from the temperature compensator,
   wherein the second mirroring unit includes:
   an NMOS transistor with long channel length configured to have a source coupled to the ground through a first resistor, a gate connected to the P-node of a PN-junction element of a basic bandgap circuit and a drain connected to a current mirror; and the current mirror configured to mirror a current flowing through the first resistor connected to the output of the first mirroring unit and to the input of the reference voltage providing unit through a second resistor, wherein the current mirror comprises two PMOS transitors and has the area ratio of N:1 to control the mirroring current for the temperature compensation between the positive temperature coefficient and the negative temperature coefficient and to have a low power consumption and small layout area of the first resistor.

7. The reference voltage bias circuit of claim 6, wherein the basic bandgap circuit includes:

a first input terminal configured to include a first PMOS transistor having a source connected to a supply voltage, a gate connected to an output of the amplifier and a drain connected to a negative input of the amplifier; and a first PN-junction element whose P-node is connected to the drain of the first PMOS transistor and N-node is connected a ground; and a second input terminal configured to include a second PMOS transistor having a source connected to the supply voltage, a gate connected to the output of the amplifier, and a drain connected to a positive input of the amplifier; a third resistor having a first terminal connected to the drain of the second PMOS transistor; and a second PN-junction element whose P-node is connected to a second terminal of the third resistor and N-node is connected the ground.

8. The reference voltage bias circuit of claim 7, wherein a junction area ratio of the first and second PN-junction elements controls a gradient for temperature compensation corresponding to currents flowing through the first and the second PN-junction elements.

9. The reference voltage bias circuit of claim 7, wherein a junction area ratio of the first and second PN-junction elements is decided with the number of a same area's PN-junction element.

10. The reference voltage bias circuit of claim 7, wherein the first mirroring unit includes:

a current mirror structure having a third PMOS transistor whose source is connected to the supply voltage, gate is connected to the gate of the second PMOS transistor of the basic bandgap circuit to get the positive temperature coefficient characteristic, and drain is connected to the second mirroring unit and the reference voltage providing unit.

* * * * *